United States Patent
Maas et al.

[11] Patent Number: 5,828,122
[45] Date of Patent: Oct. 27, 1998

[54] SEMICONDUCTOR BODY WITH A SUBSTRATE GLUED TO A SUPPORT BODY

[75] Inventors: Henricus G. R. Maas; Ronald Dekker; Theodorus M. Michielsen; Wilhelmus T. A. J. Van Den Einden, all of Eindhoven, Netherlands

[73] Assignee: U.S. Philips Corporation, New York, N.Y.

[21] Appl. No.: 815,253

[22] Filed: Mar. 12, 1997

[30] Foreign Application Priority Data

Mar. 12, 1996 [EP] European Pat. Off. .............. 96200673

[51] Int. Cl.$^6$ .................................................. H01L 29/00
[52] U.S. Cl. ............................................. 257/531; 257/724
[58] Field of Search ..................... 257/531, 684, 257/724

[56] References Cited

U.S. PATENT DOCUMENTS

| | | | |
|---|---|---|---|
| 4,450,377 | 5/1984 | Briese | 310/348 |
| 4,626,478 | 12/1986 | van Dyh Soerewyn | 257/676 |
| 4,635,356 | 1/1987 | Ohuchi et al. | 29/841 |
| 5,564,181 | 10/1996 | Dineen et al. | 29/841 |

FOREIGN PATENT DOCUMENTS

| | | |
|---|---|---|
| 0570224A2 | 5/1993 | European Pat. Off. . |
| 0570224A2 | 11/1993 | European Pat. Off. . |
| 3094188 | 4/1991 | Japan . |

*Primary Examiner*—Mark V. Prenty
*Attorney, Agent, or Firm*—Steven R. Biren

[57] ABSTRACT

A semiconductor device comprises a substrate (1) with a plane surface (4) on which a layer structure (2) is formed in a number of layers (5, 7, 9, 13, 15, 17). The side of the substrate on which the layer structure was formed is fastened to a plane support body (18) by means of a glue layer (19) which encompasses spacer elements (20). These spacer elements are fastened to the surface of the substrate and all have the same height measured from the surface (4). In fastening the substrate to the support body, glue is provided and the substrate is pressed onto the support body so that the pressure is evenly distributed over the spacer elements.

13 Claims, 3 Drawing Sheets

SEMICONDUCTOR BODY WITH A SUBSTRATE GLUED TO A SUPPORT BODY

BACKGROUND OF THE INVENTION

This invention relates to a semiconductor device with a substrate having a plane surface on which a layer structure is formed in a number of layers, which substrate is fastened with its side on which the layer structure was formed to a plane support body by means of a layer of glue comprising spacer elements.

The layer structure may be formed, for example, in a layer of semiconductor material, a layer of insulating material, a layer of conductive material, and a layer of passivating material. The layer of semiconductor material is formed, for example, on the surface of an insulating substrate. First one or several semiconductor elements are formed in the layer of semiconductor material. The layer of semiconductor material may subsequently be removed from the surface next to the semiconductor elements. Then the layer of insulating material is deposited. After the latter has been provided with contact windows, the layer of conductive material is deposited and a pattern of conductors is formed. The semiconductor elements are contacted by means of these conductor tracks. Finally, the layer of passivating material is deposited for protecting the semiconductor elements and the conductor tracks against outside influences.

The support body gives strength to the entire assembly after gluing, so that the substrate may be very thin. The process may start, for example, with a silicon wafer on which a layer of silicon oxide and a layer of silicon are formed. The layer structure is subsequently provided in and on the silicon layer. Then the silicon wafer is glued with its side on which the layer structure was formed to a support body. After gluing, finally, the silicon is removed from the side remote from the support body until the silicon oxide layer is reached. The substrate in this case is formed by the comparatively thin layer of silicon oxide.

Glue is provided for fastening the substrate to the support body, whereupon the substrate and the support body are pressed against each other. The spacer elements achieve that the glue is not pressed out entirely from between the substrate and the support body and that the substrate and the support body are fastened parallel to one another with a certain defined interspacing.

Such a semiconductor device is known from EP-A-570 224, where the spacer elements are globules of silicon oxide or synthetic resin. Before the substrate is fastened to the support body, a planarizing layer is also provided on the substrate.

The planarizing layer, used in the known device described, for fastening the substrate to the support body renders the manufacture of the device complicated and thus expensive.

SUMMARY OF THE INVENTION

The invention has for an object, inter alia, to provide a semiconductor device of the kind mentioned in the opening paragraph in which the fastening of the substrate to the support body can be achieved in a simpler manner.

According to the invention, the semiconductor device is for this purpose characterized in that the spacer elements are fastened on the surface of the substrate and all have an equal height measured from the surface.

The upper tips of the spacer elements define a plane which extends parallel to the surface of the substrate. When the substrate and the plane support body are pressed together after the addition of glue, the substrate and the support body will be fastened to one another in parallel. In addition, the pressure is evenly distributed over all spacer elements during this. This procedure is not the case when loose spacer elements in the form of globules are used, without the use of a planarizing layer. The layer structure formed on the substrate surface itself is not plane. Without a planarizing layer, globules could lie on the non-plane surface of the layer structure, with the result that the pressure during gluing is absorbed by only a few globules. Very great forces could thus occur locally on the layer structure, which could cause damage. The use of the planarizing layer in the known device serves to distribute the pressure evenly over the spacer elements during gluing.

The spacer elements may be formed in a layer of a comparatively hard material such as, for example, silicon oxide, which is provided on the substrate separately from the other layers. This layer may be provided in any thickness desired, so that the interspacing between the surface of the substrate and the support body may be adjusted to any desired value. The formation of spacer elements in this manner does require additional process steps. These additional process steps are avoided when the spacer elements are formed in a stack of those layers in which the layer structure is formed anyway. No extra layer need be deposited, and a pattern of spacer elements may be realized simultaneously with the formation of the layer structure and by means of the same photoresist masks.

In determining which layers are to be included in said stack, it should be ascertained how high the layer structure will be on the surface of the substrate. This is not necessary if the stack comprises all layers in which the layer structure is formed. The spacer elements will then always be at least as high as the maximum thickness of the layer structure to be achieved.

Preferably, the pattern of spacer elements is formed in a portion only of the layers of the stack. The pattern may be formed, for example, in all layers except in a passivating top layer. The spacer elements will then be covered by this passivating layer. Other layers in the spacer elements are protected in that case and do not come into contact, for example, with the glue by means of which the substrate and the support body are fastened to one another. If a comparatively thick metal layer is present in the stack of layers, the pattern of spacer elements may be formed, for example, only in this comparatively thick layer and not in the layers provided under and on the metal layer. Since the metal layer is comparatively thick, it is possible to etch a profile therein which is practically not disturbed by the layers provided thereon such as, for example, a much thinner layer of passivating material. It may thus be achieved that substantially no glue layer is formed between the spacer elements and the support body during making of the glue connection. The distance between the surface of the substrate and the support body is then defined by the height of the spacer elements. A space saving on the substrate is possible here if the spacer elements at the same time form circuit elements. In the comparatively thick metal layer mentioned above, for example, a coil may advantageously be formed.

BRIEF DESCRIPTION OF THE DRAWING

The invention will be explained in more detail below by way of example with reference to the accompanying drawing in which.

DESCRIPTION OF THE PREFERRED EMBODIMENTS

Figure 1:
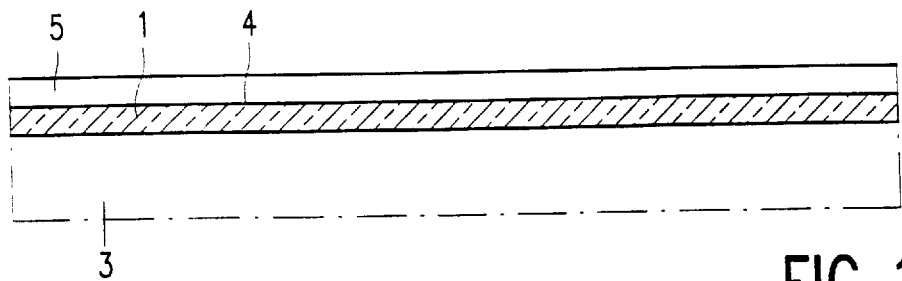
FIGS. 1 to 3 diagrammatically and in cross-section show a few stages in the manufacture of a first semiconductor device according to the invention, FIGS. 4 to 6 diagrammatically and in cross-section show a few stages in the manufacture of a second semiconductor device according to the invention, and FIGS. 7 to 10 diagrammatically and in cross-section show a few further semiconductor elements according to the invention with various embodiments of spacer elements.
Figure 2:
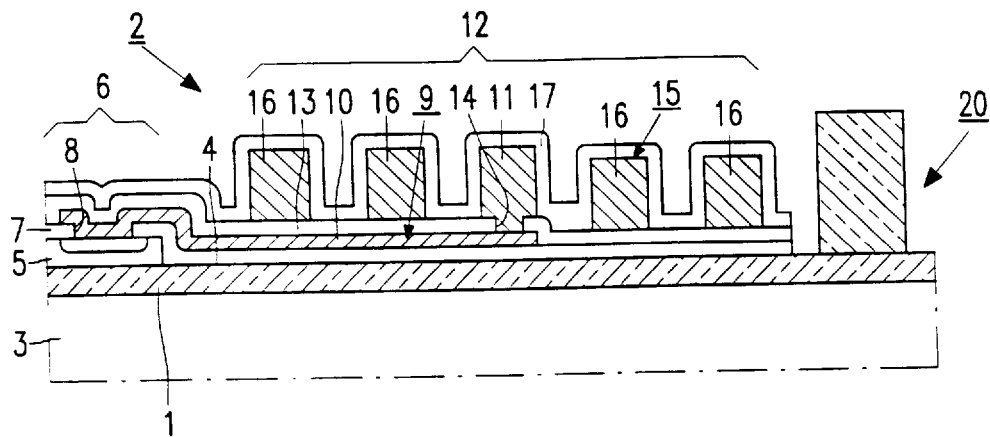
Figure 3:
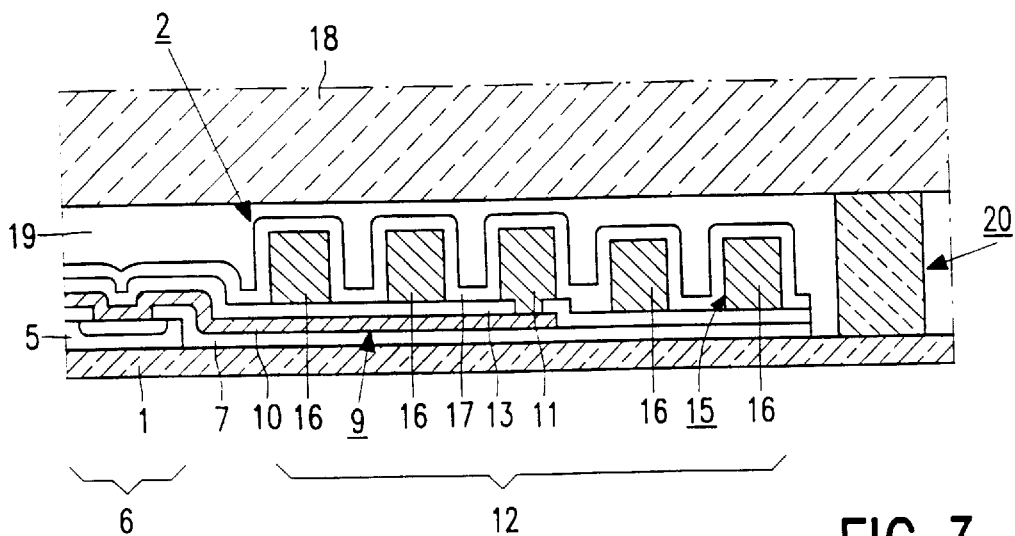

FIGS. 1 to 3 diagrammatically and in cross-section show a few stages in the manufacture of a first semiconductor device with a substrate 1 on which a layer structure 2 is formed in a number of layers. The present example starts with a silicon wafer 3 on which an approximately 0.5 µm thick silicon oxide layer 1 is provided which will form the substrate of the semiconductor device, with an approximately 0.5 µm thick silicon layer 5. The silicon layer 5 may be a monocrystalline layer as well as an amorphous or polycrystalline layer. One or several semiconductor elements 6 such as diodes, transistors, or circuits comprising transistors are first formed in the silicon layer 5 in a usual manner. Only one semiconductor element 6 is depicted in the Figures very diagrammatically so as to keep the drawing simple. The silicon layer 5 is removed from the surface 4 next to the semiconductor element 6 once the latter has been formed.

After the semiconductor element 6 has been thus completed, a layer of insulating material 7 of, for example, silicon oxide is deposited. After this layer has been provided with a contact window 8 for contacting the semiconductor element 6, a layer of conductive material 9 is deposited and a pattern of conductors is etched therein. In the drawing, a conductor 10 belonging to this pattern is shown, connecting the semiconductor element 6 to an end 11 of a coil 12 yet to be formed. A further layer of insulating material 13, i.e. silicon oxide, is now provided and is given a contact window 14, whereupon a comparatively thick metal layer 15, for example aluminum, is deposited in which the coil 12 having turns 16 is formed. Finally, a layer of passivating material 17, for example, silicon nitride, is deposited.

Thus the layer structure 2 is formed on the surface 4 of the substrate 1, in this first example in the layers of semiconductor material 5, insulating material 7, conductive material 9, insulating material 13, conductive material 15, and passivating material 17. The layer of conductive material 15 in which the coil 12 is formed is approximately 3 µm thick, the other layers approximately 0.5 µm.

The substrate 1 is subsequently fastened with its side on which the layer structure 2 was formed to a plane, for example glass support body 18 by means of a glue layer 19 which encompasses spacer elements 20. After gluing, finally, the silicon is etched away from the wafer 3 on which the layer of silicon oxide forming the substrate 1 lies. The support body gives strength to the entire assembly after gluing, so that the substrate 1 may be very thin.

Glue is introduced during fastening of the substrate 1 to the support body 18, whereupon the substrate 1 and the support body 18 are pressed against each other. The spacer elements 20 achieve that the glue is not pressed out entirely from between the substrate 1 and the support body 18, and the substrate 1 and support body 18 are fastened to one another in parallel with a certain defined interspacing.

Figure 4:
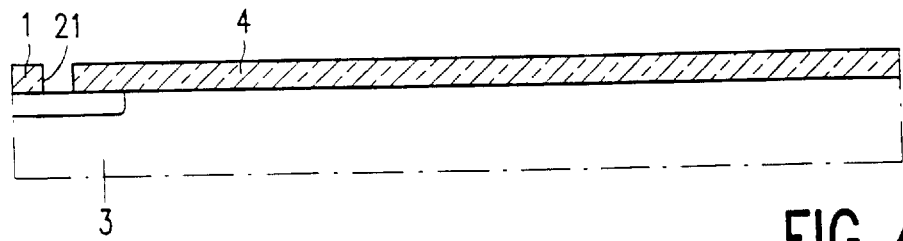
Figure 5:
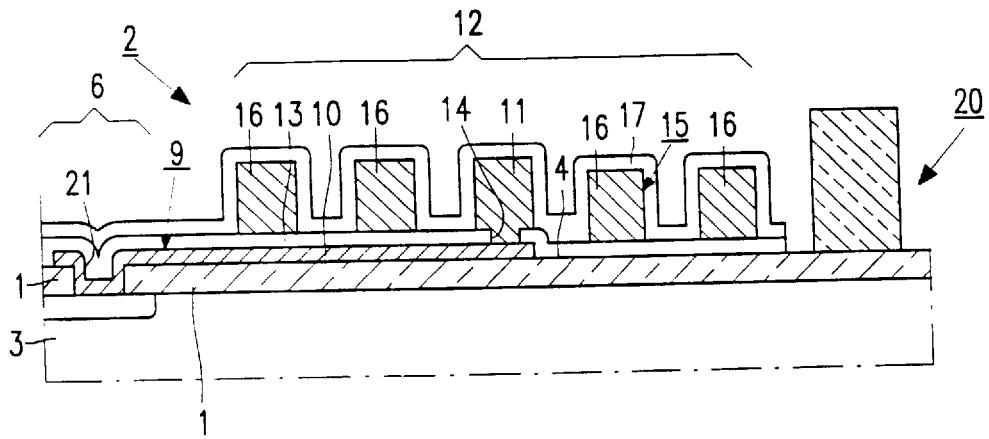
Figure 6:
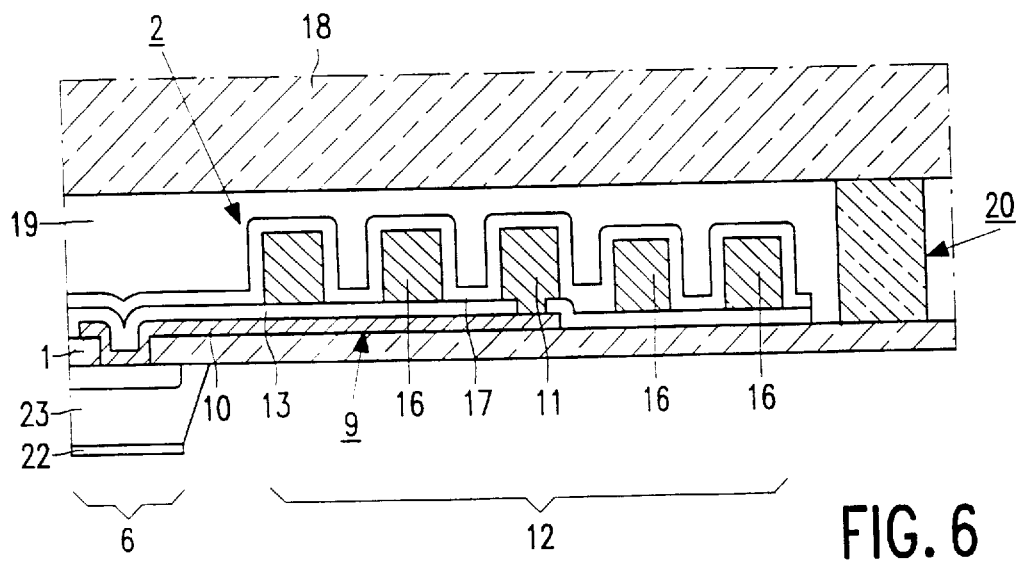
Figure 7:
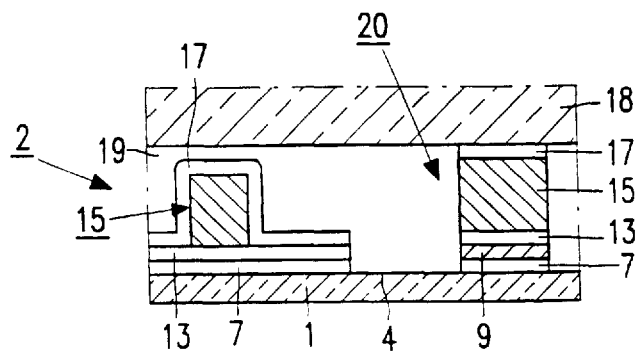

FIGS. 4 to 6 diagrammatically and in cross-section show a few stages in the manufacture of a second semiconductor device. Corresponding components and layers have been given the same reference numerals in these Figures as in the FIGS. 1 to 3. The manufacture of the second semiconductor body starts with a silicon wafer 3 on which an approximately 0.5 µm thick silicon oxide layer 1 is provided which will form the substrate of the semiconductor device. First one or several semiconductor elements 6 such as diodes, transistors, or circuits comprising transistors are formed in the silicon wafer 3 in a usual manner for the second semiconductor device. Only one semiconductor element 6 is depicted very diagrammatically in the Figures so as to keep the drawing simple. The layer structure is provided on the surface 4 of the substrate 1.

The silicon oxide layer 1 is provided with a contact window 21 for contacting the semiconductor element 6, whereupon a layer of conductive material 9 is deposited in which a pattern of conductors is etched. A conductor 10 of this pattern is shown in the drawing, connecting the semiconductor element 6 to an end 11 of a coil 12 yet to be formed. After a layer of insulating material 13 of silicon oxide has been provided and given a contact window 14, a comparatively thick metal layer 15, for example aluminum, is deposited, and the coil 12 having turns 16 is formed therein. Finally, a layer of a passivating material 17 such as, for example, silicon nitride is deposited.

The layer structure 2 has thus been formed on the surface 4 of the substrate 1 and comprises the layers of conductive material 9, insulating material 13, conductive material 15, and passivating material 17. The layer of conductive material 15 in which the coil 12 was formed is approximately 3 µm thick, the other layers approximately 0.5 µm.

The substrate 1 is fastened with its side on which the layer structure 2 was formed to a plane, for example glass support body 18, again in this second example by means of a glue layer 19 which encompasses spacer elements 20. In this second example, the silicon is etched away from the wafer 3 on which the silicon oxide layer forming the substrate 1 lies, next to the semiconductor element 6 after gluing. This is done in this example in that first, part of the silicon is removed in a polishing operation, subsequently an etching mask 22 is provided, and finally silicon is etched away in a KOH solution. The semiconductor element 6 is now present in a small slice of semiconductor material 23 which lies at the side of the substrate facing away from the layer structure. The support body gives strength to the entire assembly after gluing, so that the substrate 1 may be very thin.

In both examples, the coil 12 lies on the thin insulating substrate 1 and accordingly has a high quality factor.

Only one spacer element 20 is shown in each example, but it will be obvious that a pattern of such spacer elements will be provided, distributed over the entire wafer of semiconductor material 3. Since these elements all have the same height, it is achieved that the substrate 1 and the plane support body 18 are fastened to each other in parallel after the application of glue and after pressing together of the substrate and support body, the pressure being evenly distributed over all spacer elements 20.

The spacer elements 20 are formed in a layer of a comparatively hard material such as, for example, silicon oxide in the two devices shown in FIGS. 3 and 6, which layer is provided separately from the other layers on the substrate 1. Such a layer may be provided to any desired thickness, so that the interspacing between the surface 4 of the substrate 1 and the support body 18 may be adjusted to any value as desired.

Preferably, the spacer elements 20 are formed in a stack of the layers in which the layer structure 2 is formed, as shown in FIGS. 7 to 10. It is not necessary then to deposit an extra layer. In addition, the pattern of spacer elements 20 may then be realized simultaneously with the formation of the layer structure 2 and by means of the same photoresist masks.

FIGS. 7 to 10 show a number of possible spacer elements which can be realized in the layers used in the first semiconductor device shown in FIG. 3. It will be obvious that similar spacer elements may be formed in the layers used in the second semiconductor device shown in FIG. 6.

In determining which layers are to be included in the stack, it should be ascertained how high the layer structure will be on the surface of the substrate. The turns 16 of the coil 12 form the highest points in the layer structure 2. It is apparent from FIG. 3 that these highest points are formed by a stack of the layers of insulating material 7, conductive material 9, insulating material 13, conductive material 15, and passivating material 17. The spacer element 20 is formed in a stack also comprising these layers 7, 9, 13, 15, 17. The spacer elements 20 are as high as the highest point of the layer structure 2 in this case.

Figure 8:
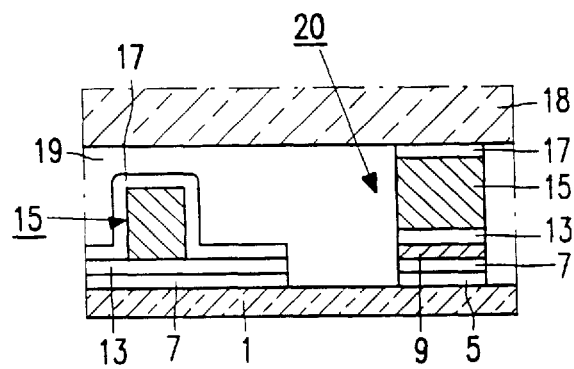

FIG. 8 shows the formation of a spacer element 20 formed in a stack of all layers which are provided on the surface 4 of the substrate 1. The spacer element shown in FIG. 8 comprises, besides the layers of the spacer element drawn in FIG. 7, also the layer of semiconductor material 5. The spacer elements 20 are always at least as high as the maximum achievable thickness of the layer structure 2 in this case.

Figure 9:
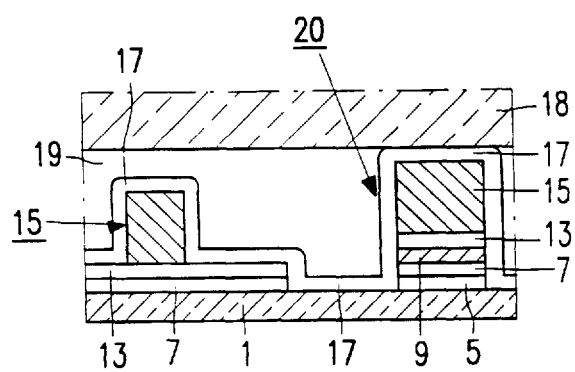

Preferably, the pattern of spacer elements 20 is formed in only a portion of the layers of the stack. FIG. 9 shows the formation of a spacer element 20 which is formed in a stack of layers 5, 7, 9, 13, 15 and 17, where only the layers 5, 7, 9, 13 and 15 are etched into a pattern. The spacer elements 20 are entirely covered by the passivating layer 17. The other layers in the spacer elements 20 are protected by this layer 17 and do not come into contact, for example, with the glue 19 by means of which the substrate 1 and the support body 18 are fastened to one another.

Figure 10:
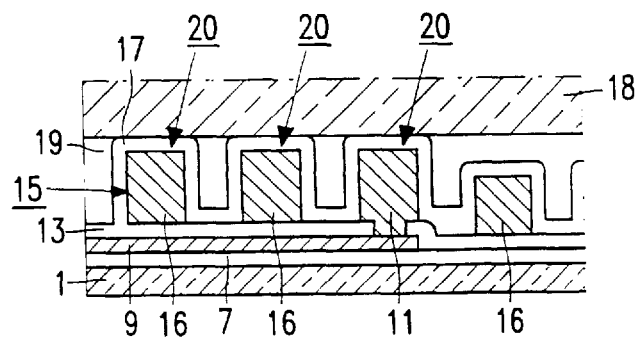

Space is saved on the substrate 1 when the spacer elements 20 at the same, time constitute circuit elements. FIG. 10 shows spacer elements which double as turns 16 of the coil 12 formed in the comparatively thick layer of conductive material 15. The spacer elements 20 are formed by those turns 16 of the coil 12 which lie on the layers 7, 9 and 13. The spacer elements are accordingly formed in the layers 7, 9, 13, 15 and 17. Since the metal layer 15 is comparatively thick, it is possible to etch a profile therein which is substantially not disturbed by the layer 17 provided thereon. It can be achieved thereby that substantially no glue layer 19 is formed between the spacer elements 20 and the support body 18 when the glue connection is being made.

We claim:

1. A semiconductor device comprising a substrate having a plane surface on which a layer structure is formed in a number of layers, a side of the substrate on which the layer structure is formed being fastened to a plane support body by means of a layer of glue encompassing spacer elements, wherein the spacer elements are fastened on the surface of the substrate and all have an equal height measured from the substrate surface, and wherein the spacer elements comprise a stack comprising the layers in which the layer structure is formed.

2. A semiconductor device as claimed in claim 1, wherein said stack comprises all layers in which the layer structure is formed.

3. A semiconductor device as claimed in claim 1, wherein a pattern for the spacer elements is formed in only a portion of the layers of the stack.

4. A semiconductor device as claimed in claim 3, wherein the space elements each form a circuit element of the semiconductor device.

5. A semiconductor device as claimed in claim 4, wherein said circuit element comprises a coil.

6. The semiconductor device as claimed in claim 2 wherein a pattern of spacer elements is formed in only a portion of the layers of the stack.

7. The semiconductor device as claimed in claim 1 wherein the plane support body comprises an insulation material.

8. The semiconductor device as claimed in claim 7 wherein the spacer elements are integral with the substrate.

9. The semiconductor device as claimed in claim 1 wherein said layer structure comprises at least one semiconductor element formed in a silicon layer of the semiconductor device.

10. The semiconductor device as claimed in claim 1 wherein a layer of passivating material is present between the spacer elements and the support body and in contact with the support body.

11. The semiconductor device as claimed in claim 1, wherein the substrate comprises a layer of silicon oxide.

12. The semiconductor device as claimed in claim 1 wherein the height of the spacer elements is greater than the height of the layer structure from the surface of the substrate.

13. The semiconductor device as claimed in claim 1 wherein the height of the spacer elements is greater than the height of any circuit elements located on said side of the substrate.

* * * * *